(12) United States Patent
Manor

(10) Patent No.: US 6,420,245 B1
(45) Date of Patent: Jul. 16, 2002

(54) METHOD FOR SINGULATING SEMICONDUCTOR WAFERS

(75) Inventor: Ran Manor, Haifa (IL)

(73) Assignee: Kulicke & Soffa Investments, Inc., Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 09/845,890

(22) Filed: Apr. 30, 2001

Related U.S. Application Data

(63) Continuation-in-part of application No. 09/817,959, filed on Mar. 27, 2001, which is a continuation-in-part of application No. 09/327,722, filed on Jun. 8, 1999, now abandoned.

(51) Int. Cl.[7] .............................................. H01L 21/78
(52) U.S. Cl. ...................... 438/460; 438/461; 438/462; 438/465
(58) Field of Search ................................ 438/460, 461, 438/42, 465

(56) References Cited

U.S. PATENT DOCUMENTS

| | | |
|---|---|---|
| 4,543,464 A | 9/1985 | Takeuchi |
| 4,716,270 A | 12/1987 | Gnanamuthu et al. |
| 4,861,964 A | 8/1989 | Sinohara |
| 4,865,686 A | 9/1989 | Sinohara |
| 5,151,389 A | 9/1992 | Zapella |
| 5,185,295 A | 2/1993 | Goto et al. |
| 5,552,345 A | 9/1996 | Schrantz et al. |
| 5,922,224 A  * | 7/1999 | Broekroelofs .......... 219/121.72 |
| 6,257,224 B1 * | 7/2001 | Yoshino et al. .......... 125/13.01 |

FOREIGN PATENT DOCUMENTS

| | | |
|---|---|---|
| EP | 0 818 818 A | 1/1998 |
| JP | 53033050 | 3/1978 |
| JP | 58036939 | 3/1983 |
| JP | 10321908 | 12/1998 |

OTHER PUBLICATIONS

International Search Report of PCT/US0015530, filed Jun. 5, 2000.

* cited by examiner

Primary Examiner—David Nelms
Assistant Examiner—Thao P. Le
(74) Attorney, Agent, or Firm—Ratner & Prestia

(57) ABSTRACT

A method and apparatus for singulating semiconductor wafers is described. The method comprises the steps of aiming a laser beam at a layer placed over the substrate; absorbing energy from the laser beam into the layer; forming scribe lines in the layer by scanning the laser beam across the layer; and cutting through the substrate along the scribe lines with a saw blade to singulate the wafer. The apparatus includes a laser placed over the coating layer of the substrate, and a saw blade mounted over a surface of the substrate. The coating layer has a first absorption coefficient relative to a wavelength of the laser and the semiconductor substrate has a second absorption coefficient less than the first absorption coefficient. Energy from the laser beam is absorbed into the coating layer to form scribe lines therein, and the saw blade cuts through the substrate along the scribe lines.

31 Claims, 17 Drawing Sheets

METHOD FOR SINGULATING SEMICONDUCTOR WAFERS

This application is a Continuation-in-Part of pending application Ser. No. 09/817,959 filed on Mar. 27, 2001, which is a Continuation-in-Part of pending application Ser. No. 09/327,722 filed on Jun. 8, 1999 abandoned.

FIELD OF THE INVENTION

This invention relates generally to dicing of semiconductor wafers. More specifically, the present invention relates to a method and apparatus for laser scribing followed by mechanical dicing of the semiconductor wafers.

BACKGROUND OF THE INVENTION

Die separation, or dicing, by sawing is the process of cutting a microelectronic substrate into its individual circuit die with a rotating circular abrasive saw blade. This process has proven to be the most efficient and economical method in use today. It provides versatility in selection of depth and width (kerf) of cut, as well as selection of surface finish, and can be used to saw either partially or completely through a wafer or substrate.

Wafer dicing technology has progressed rapidly, and dicing is now a mandatory procedure in most front-end semiconductor packaging operations. It is used extensively for separation of die on silicon integrated circuit wafers.

Increasing use of microelectronic technology in microwave and hybrid circuits, memories, computers, defense and medical electronics has created an array of new and difficult problems for the industry. More expensive and exotic materials, such as sapphire, garnet, alumina, ceramic, glass, quartz, ferrite, and other hard, brittle substrates, are being used. They are often combined to produce multiple layers of dissimilar materials, thus adding further to the dicing problems. The high cost of these substrates, together with the value of the circuits fabricated on them, makes it difficult to accept anything less than high yield at the die-separation phase.

Dicing is the mechanical process of machining with abrasive particles. It is assumed that this process mechanism is similar to creep grinding. As such, a similarity may be found in material removal behavior between dicing and grinding. The size of the dicing blades used for die separation, however, makes the process unique. Typically, the blade thickness ranges from 0.6 mils to 50 mils (0.015 mm to 1.27 mm), and diamond particles (the hardest known material) are used as the abrasive material ingredient. Dicing saw blades are made in the form of an annular disc that is either clamped between the flanges of a hub or built on a hub that accurately positions the thin flexible saw blade. Because of the diamond dicing blade's extreme fineness, compliance with a strict set of parameters is imperative, and even the slightest deviation from the norm can result in complete failure.

FIG. 1 is an isometric view of a semiconductor wafer 100 during the fabrication of semiconductor devices. A conventional semiconductor wafer 100 may have a plurality of chips, or dies, 100a, 100b, . . . formed on its top surface. In order to separate the chips 100a, 100b, . . . from one another and the wafer 100, a series of orthogonal lines or "streets" 102, 104 are cut into the wafer 100. This process is also known as dicing the wafer.

IC wafers are coated with various layers such as passivation of oxides or nitrides, dielectrics, polymer coatings, and aluminum as well as copper metal pads (all collectively shown as 106 in FIG. 1). The wafer scribe lines (streets) reflect similar coatings on the chips, since all of the test devices and alignment marks are located within the scribe line borders. The wafer streets are therefore fully or partially coated with different materials and are largely non-homogeneous. This combination of materials has a significant effect on wafer dicing and die edge quality. When conventional dicing technology is used, such as a single blade and a single cut, the die edge on the bottom side of semiconductor wafer suffers severe backside chipping (BSC). In addition, on the topside of the wafer, problems at the die edge include cracking of the passivation and dielectric layers, the smearing or tearing of the metal pads, and the formation of polymer slivers.

One approach to overcome the aforementioned die edge problems is a mechanical dual dicing method. This method is a combination of two cuts (step cut), the first one being shallow and the second one being a through cut. The purpose of the first cut is to remove all the coatings 106 from the streets 102, 104 of semiconductor wafer 100 in order to permit a smooth through cut. The first cut, is performed using either a beveled blade or a standard blade that penetrates the silicon s wafer as well. The removal of the coatings, passivation, dielectrics and metal pads 106 from the streets 102, 104 also affects the backside chipping. As a result, the size of chipping is reduced.

There are many disadvantages, however, to the step cut. First, the process throughput is reduced dramatically, since instead of one pass in the street, two passes are required. Second, the mechanical removal of the coatings creates residual cracks, which, in turn, cause further deterioration of the dice. Third, when the bevel blade wears out, the kerf gets wider and this requires frequent handling and replacement of the blade. Forth, the price of bevel blades is more expensive by a factor of five compared to a standard blade. All these drawbacks result in a high cost of ownership with regard to the step cut process.

There are other disadvantages regarding the beveled cut. Namely, blade penetration height must be carefully monitored, because for each one micron of penetration, the kerf widens by about two microns. In addition, the beveled blade may insert hidden damage into the die edge, in the form of cracks for example. Visual inspection of dice after dicing (an industry standard) is not capable of detecting this damage.

In view of the shortcomings of the prior art, there is a need to develop a method to cut die having various coating layers and test structures in the wafer scribe lane so as to increase throughput, minimize the backside chipping, and to increase the yield of useable circuits.

SUMMARY OF THE INVENTION

In view of the shortcomings of the prior art, it is an object of the present invention to optimize the dicing process and minimize bottom side chipping (BSC) of semiconductor wafers.

The present invention is a method for dicing a semiconductor substrate by focusing a laser beam onto a coating layer over a top surface of the substrate; absorbing energy into only the layer; forming scribe lines on the substrate surface by scanning the laser beam across the surface of the substrate to evaporate only portions of the layer; and dicing the substrate along the scribe lines with a saw blade.

According to another aspect of the invention, the laser emits infrared radiation.

According to still another aspect of the invention, the scribe line removes all the layers over the silicon wafer, with minimal heat damage to the silicon substrate.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

Figure 1:
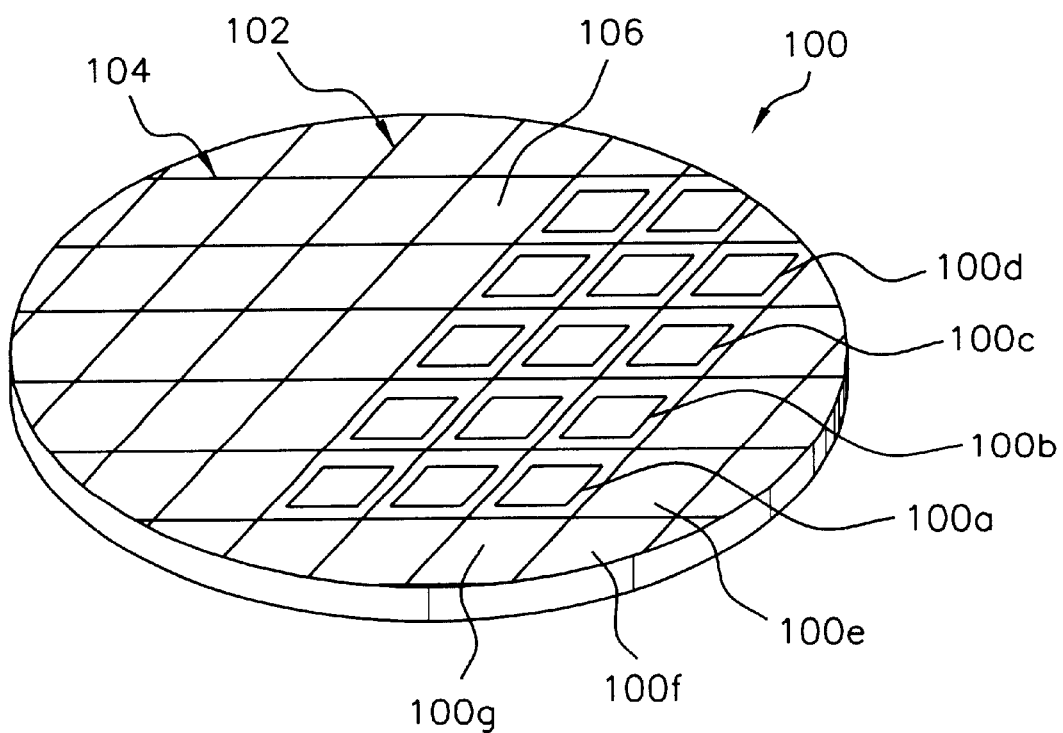
FIG. 1 is an isometric view of a semiconductor wafer used to form semiconductor devices.

In the manufacture of semiconductor devices, individual chips are cut from a large wafer using a very high speed rotating saw blade. In essence, the saw blade grinds away a portion of the wafer along linear streets or kerfs (102, 104 as shown in FIG. 1) in one direction followed by a similar second operation in an orthogonal direction.

The quality of the dice (chips) is directly related to the minimization of chipping (front and back) during the dicing operation. The inventor has determined that by removing all the layers on top of the silicon substrate using a non-mechanical approach, in the area where the substrate will be cut through, throughput is dramatically increased (by about a factor of two), front side chipping (FSC) is significantly reduced (if not completely eliminated), BSC is minimized, and device yield is increased as well.

Figure 2:
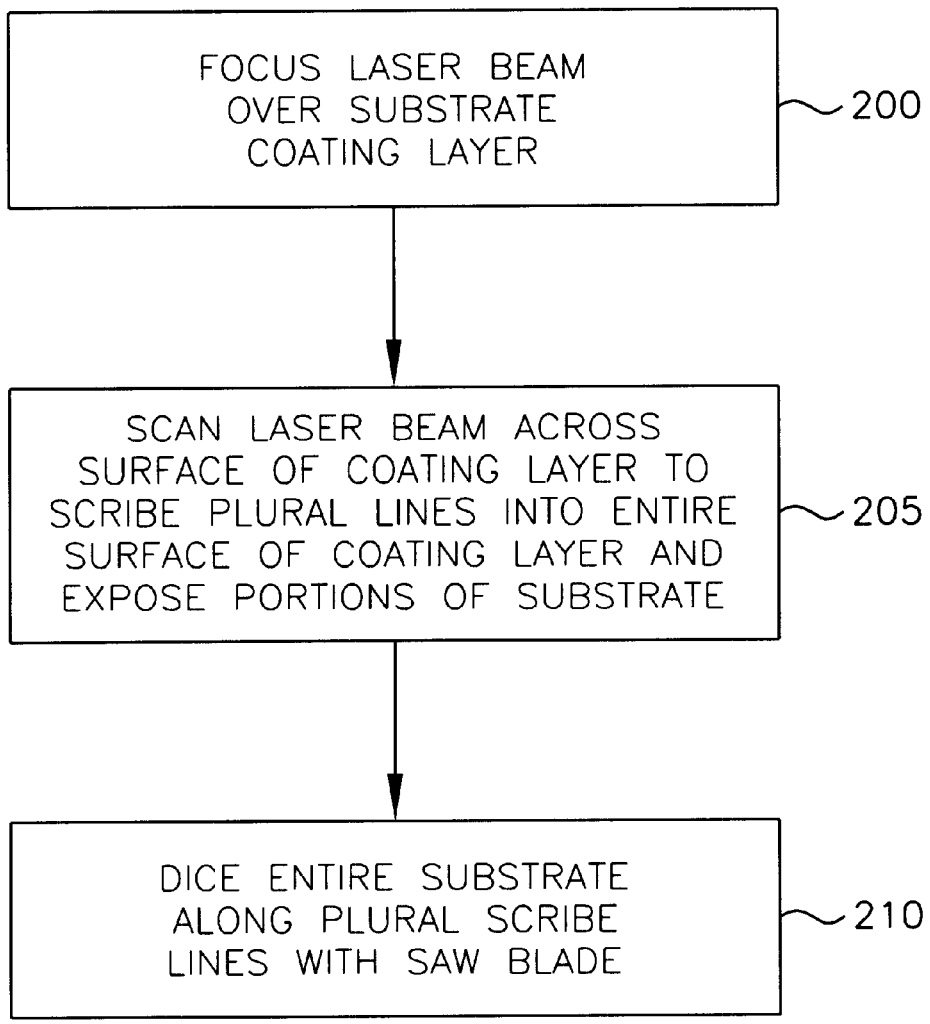
FIG. 2 is a flow chart of a first exemplary method of the present invention.
Figure 3A:
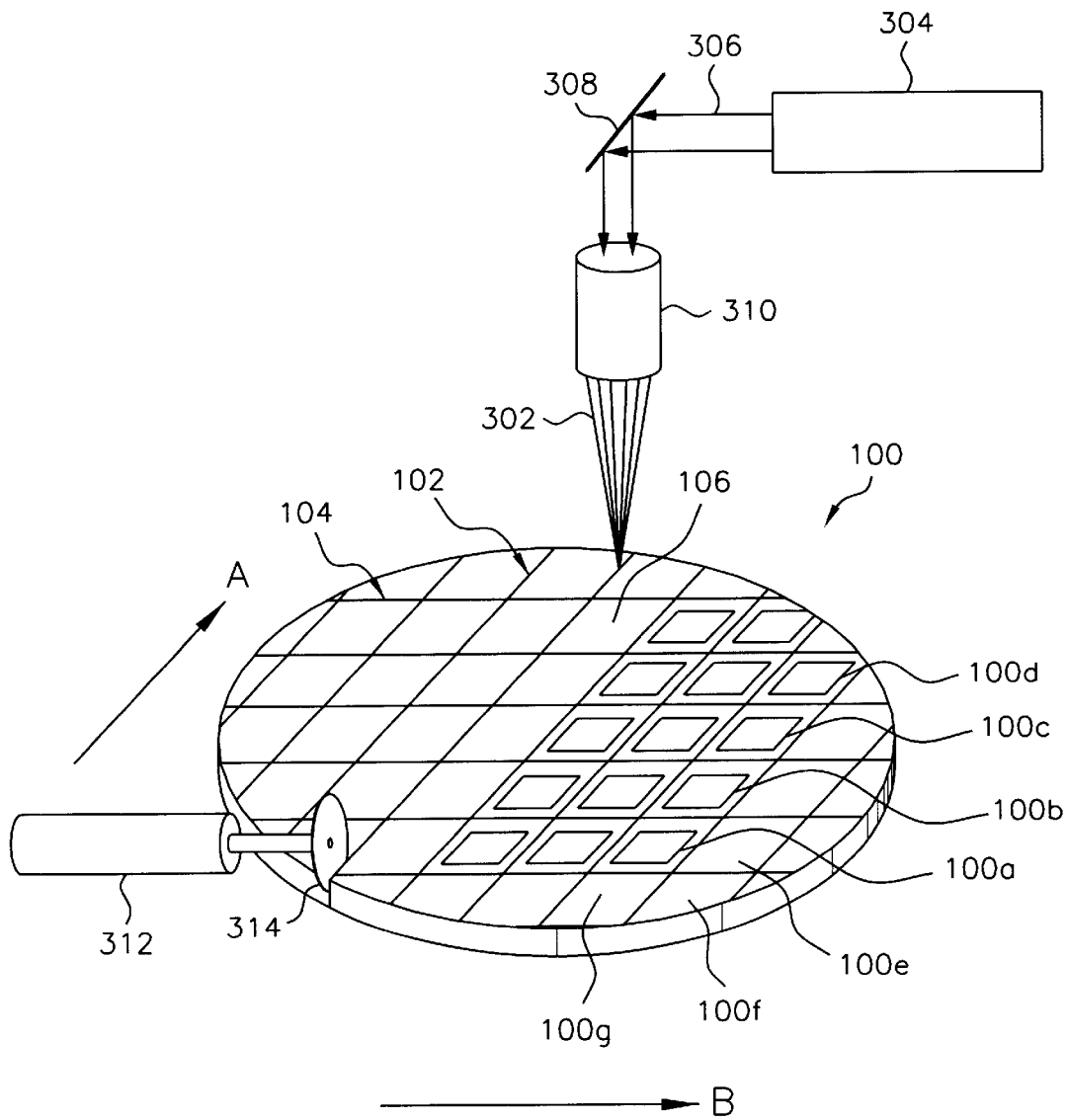
FIGS. 3A and 3B are diagrams of a first exemplary embodiment of the present invention.
Figure 3B:
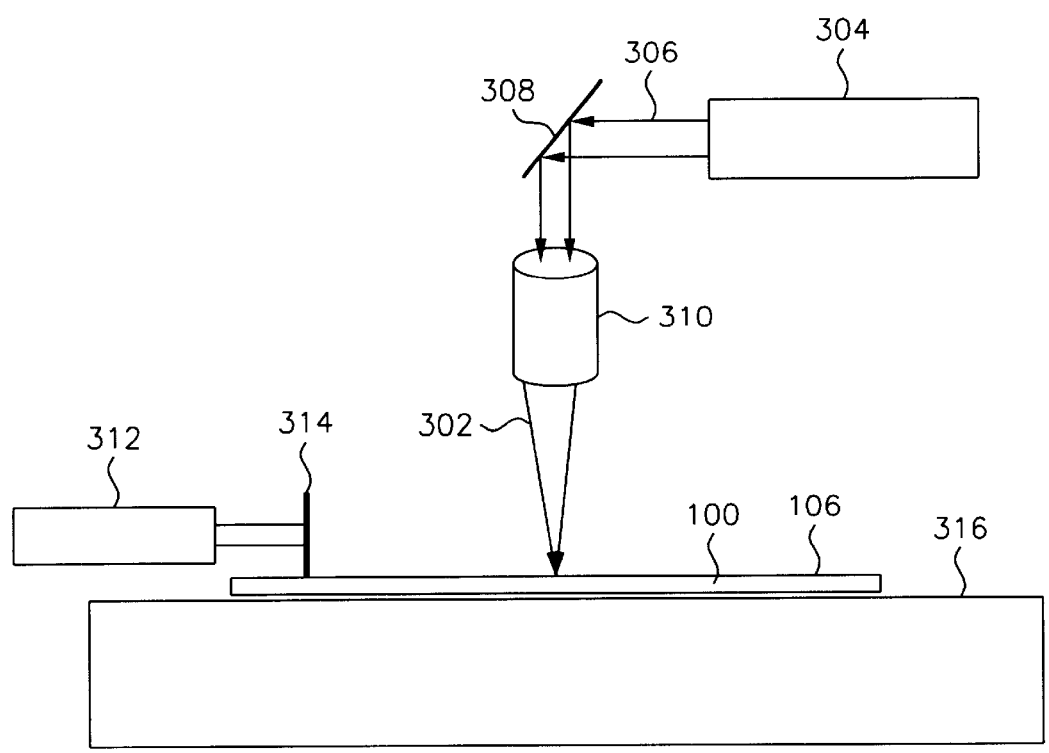

Referring to FIG. 2, a flow chart of an exemplary embodiment of the present invention is shown. Referring to FIGS. 3A and 3B, a first exemplary embodiment of the wafer singulating apparatus 300 is shown.

In FIG. 2, at Step 200, laser beam 306 from laser 304 (shown in FIGS. 3A and 3B) is directed by folding mirror 308 and focused by lens 310, as focused beam 302, onto coating layers 106 which overlie the surface of substrate 100. It should be noted that focused laser beam 302 might also be focused at a point above or below the surface of coating layers 106 or substrate 100. At Step 205, focused laser beam 302 is scanned across the surface of substrate coating layers 106 in a linear motion (in direction A for example) to remove all layers 106 by evaporation and form desired scribe lines 102.

The upper layers on top of the wafer surface are a combination of passivation layers, dielectrics, oxides, nitrides and metal pads. In most standard ICs, the total thickness of all these layers is usually less than 20 microns. The individual thickness of each layer is usually less than one micron, with the exception of the polymer layer having a thickness of few microns. The optical properties, such as absorption, reflection, and index of refraction of these layers are very different from one layer to another and from that of the silicon substrate.

One of the major concerns when processing IC wafers with laser irradiation is the high sensitivity of the device to heating and thermal damage. Excessive heating of the substrate can reduce device performance, reliability and even cause instant device failure. It is therefore necessary to use an appropriate range of laser frequencies that are strongly absorbed in the upper layers, but with minimal absorption within the substrate. One of the most suitable lasers for the suggested process in this embodiment is the $CO_2$ laser irradiating in the far infrared region of the spectrum at a wavelength of about 10.6 microns, for example. The absorption coefficient of the $CO_2$ laser energy by silicon is practically zero, and is considerably lower (by about an order of magnitude, i.e. a factor of 10, and preferably at least an order of magnitude) than the absorption coefficient of the coating layers. On the contrary, silicon heavily absorbs (absorption coefficient of $10^6 cm^{-1}$) energy in the UV range of the spectrum, such as a wavelength of about 200 nm. Laser energy sources, such as Excimer (UV) laser sources, described in the prior art to process silicon (U.S. Pat. No. 5,151,389 to Zappella, and U.S. Pat. No. 5,552,345 to Schrantz et al.) are examples of sources whose energy is readily absorbed by silicon. Nevertheless, the use of lasers emitting energy in the UV frequency range can significantly damage the silicon wafer, while the present embodiment overcomes this major deficiency by using laser radiation that is not absorbed by the silicon substrate. The silicon cannot be heated directly by far infrared laser radiation, while the upper coatings over the silicon substrate are partially or completely removed by the $CO_2$ laser beam due to the much larger absorption coefficient of the layers relative to that of the silicon substrate. An analogous approach is used in the well known process of etching, where a stop etch layer is used to increase process robustness, accuracy, and to protect other layers. In the aforementioned embodiment, the silicon substrate acts as a stop etch layer for the laser irradiation. In U.S. Pat. No. 4,716,270 to Gnanamuthu et al. totally different physics are used to differentiate between laser processing of two layers of material. In Gnanamuthu et al. the workpiece is a metal coated with an organic polymer, and the differentiation between the laser processing on the two layers is based on a reflection principle, in which the laser radiation is highly reflected from the underlying metal substrate. By contrast, the exemplary embodiment of the present invention is capable of removing thin metal layers on top of the wafer substrate, despite their high reflectivity to the laser radiation. This is possible because the exemplary process is based on absorption of the laser energy rather than reflection.

In an exemplary embodiment of the present invention, the focused laser beam 302 is about 50 $\mu$m in diameter, although other diameters may be used as necessary. The focused laser beam diameter should preferably be larger than the thickness of the dicing blade (314 in FIGS. 3A and 3B), however, in order to completely eliminate any front side chipping of the wafer. In forming streets 102, 104 focused laser beam 302 removes only the layers 106 on top of silicon substrate 100, resulting in minimal indirect heating of the silicon substrate. Complementary to the laser scribing process is the mechanical saw dicing (described in detail below) of the silicon substrate where dies are singulated.

In an exemplary embodiment, the laser assembly 322 (which includes laser 304, folding mirror 308 and lens 310) is stationary while the substrate 100 is moved in direction A, for example, using a conventional X-Y table 316 onto which the substrate 100 is mounted (by vacuum for example), to form streets 102. As each street 102 is completed, substrate 100 is translated in direction B by X-Y table 316 and the process is repeated for an additional street 102.

After all of the streets 102 are formed, substrate 100 is rotated by about 90° so that the process may be repeated to form streets 104 in substrate 100. Alternatively, laser assembly 322 may be moved relative to a stationary substrate 100 in either or both the X and Y directions.

Referring again to FIG. 2, at Step 210, substrate 100 is diced by penetrating substrate 100 along scribe lines 102, 104 with saw blade 314, under control of motor/spindle assembly 312 to form dies 100a, 100b, etc.

Although for simplicity of illustration saw blade 314 is shown positioned lateral to focused laser beam 302, the invention is not so limited, in that saw blade 314 may be placed essentially linear to focused laser beam 302 to provide for a more compact design.

One major advantage of laser scribing is that laser scribing may be performed at a much higher feed rate than the conventional step cut dicing process to remove the top layers over the substrate. It should be noted, however, that the feed rates of the abrasive dicing, which follows the laser scribing, and the scribing are not necessarily the same. For example, scribing velocities can reach up to 600 mm/sec, which is about an order of magnitude greater than a conventional feed rate used in the dicing process.

Figure 4A:
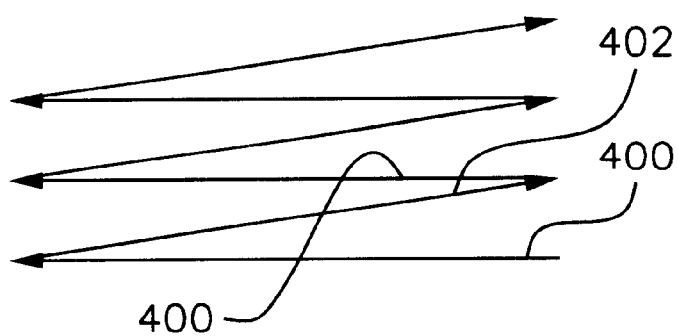
FIG. 4A is an illustration of saw blade motion.
Figure 4B:
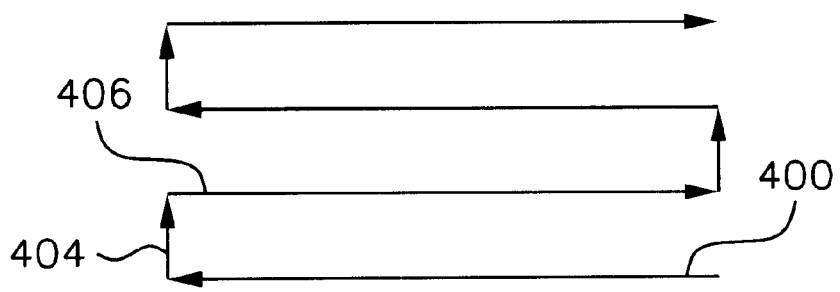
FIG. 4B is an illustration of the laser beam motion of the exemplary embodiment of the present invention.

Another advantage of the exemplary laser scribe process over conventional dicing is represented in FIGS. 4A and 4B. While dicing with a saw blade, the blade needs to penetrate the wafer from a particular direction (motion 400, shown in FIG. 4A). Therefore, in order to make successive cuts, the blade motion has a zigzag form as shown in FIG. 4A (motion 400 followed by motion 402, etc.) This approach is time consuming, however, since during the return time (motion 402) the blade can not cut. According to the exemplary embodiment of the present invention, since the laser scribing is a contact-less process the laser can operate in both directions (staggered mode) as is shown in FIG. 4B (motion 400, followed by motion 404, followed by motion 406, etc.) Therefore, the only non-scribing time is during motion 406 from a dicing street to the next dicing street.

Yet another advantage of the laser scribing over the step-bevel cut is eliminating the need for expensive blades, and allowing the possibility of sealing the passivation layer using the laser beam, thereby avoiding crack formation.

In a first exemplary method a wafer (substrate) was treated with a $CO_2$ laser beam to remove all of the coatings from the streets of the wafer (without any direct effect on the silicon substrate) prior to cutting, in order to eliminate FSC and decrease BSC. The wafer was treated with a uniform level of energy to remove the coatings over the substrate by evaporation. All the streets 102, 104 were treated according to the same parameters. The parameters of the exemplary $CO_2$ laser were as follows:

Power=20 Watts

Feed rate=16"/sec (406.4 mm/sec)

Following laser scribing, the wafer was diced with a saw blade using the following parameters:

Feed rate: 2.165"/sec (55 mm/sec),

Spindle speed: 40,000 rpm,

Blade type: 2"(50.8 mm) diameter, nickel binder, approximately 0.0012 in. (0.030 mm) thick.

Figure 5:
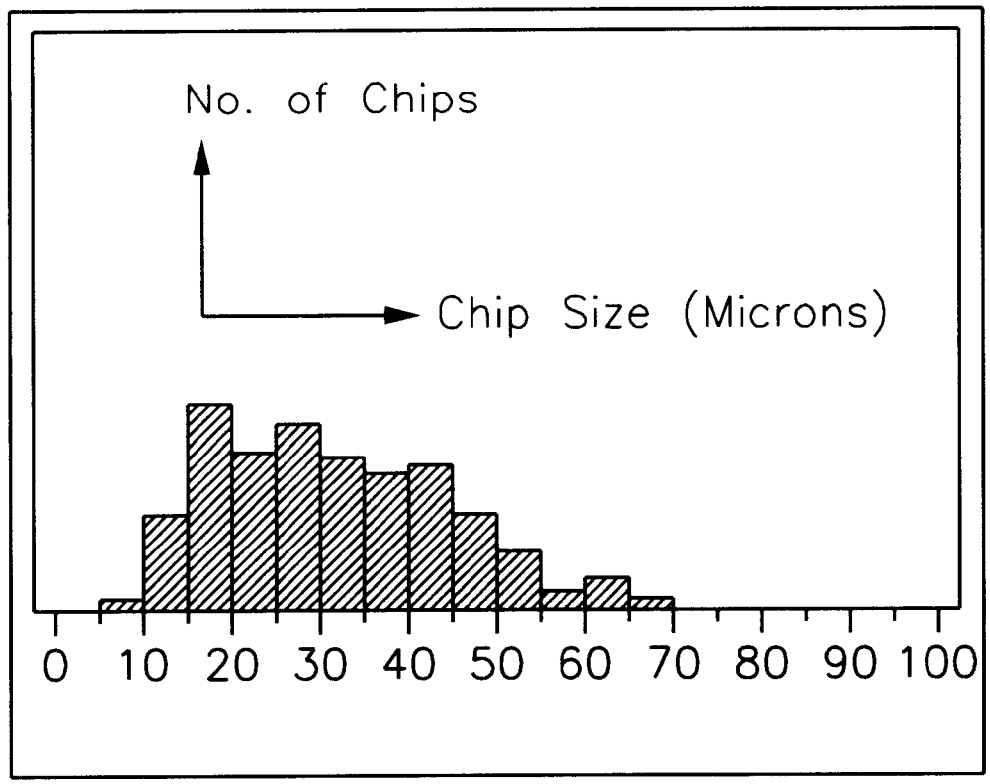
FIG. 5 is a statistical chart representing the backside chipping distribution of a silicon wafer with coatings where laser scribing assisted dicing, according to an exemplary embodiment of the present invention, was performed.

The wafer was subjected to microscopic and statistical analysis to determine the amount of BSC resulting from the dicing operation. FIG. 5 is the statistical analysis of the BSC result where the upper layers are evaporated from the street according to the first exemplary embodiment before dicing the substrate. As shown in FIG. 5, the maximum BSC is about 83 $\mu$m and the average BSC is about 31 $\mu$m.

Figure 6:
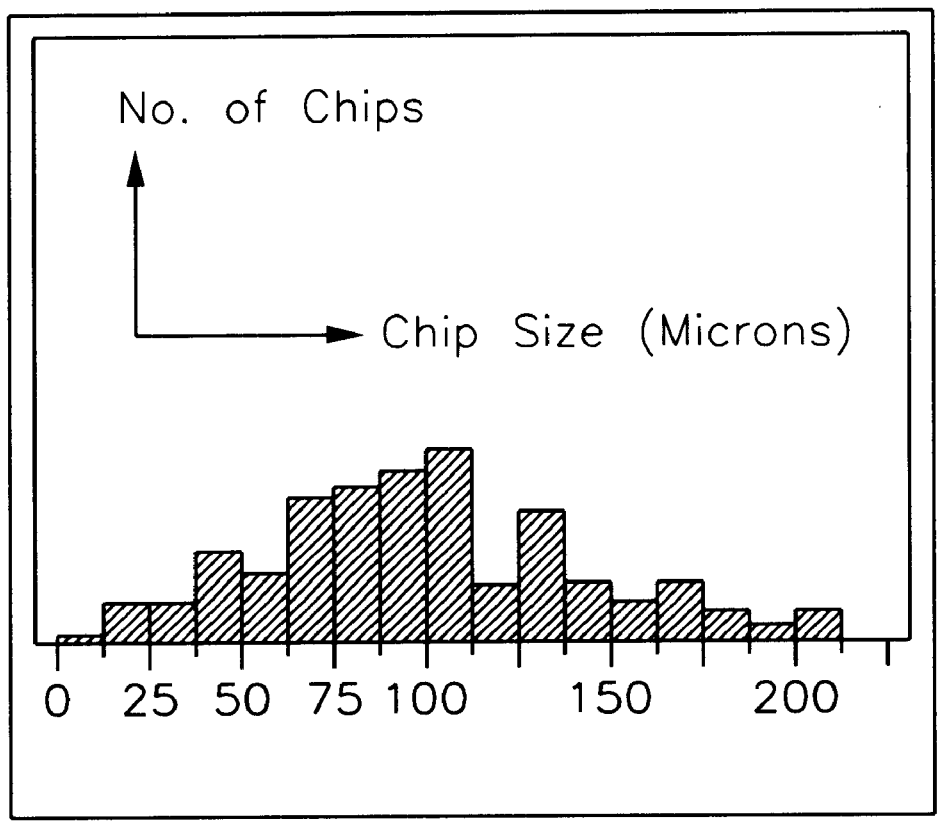
FIG. 6 is a statistical chart representing the backside chipping distribution of a silicon wafer with coatings where conventional single step dicing (untreated wafer) was performed.

By contrast, FIG. 6 is a statistical layout of the BSC result where the upper coatings were not removed according to the exemplary process before dicing the substrate. As shown in FIG. 6, the maximum BSC is about 202 $\mu$m and the average BSC is about 99 $\mu$m.

Overall, using the exemplary embodiment, the BSC improvement achieved is more than three times than the results achieved using the conventional single blade, single cut dicing method.

The laser is used primarily to remove various surface coatings, without damaging the edges of the scribe line. The improved BSC results from the removal of all the coating layers that typically clog a dicing blade resulting in excessive backside chipping.

Although specific a spindle speed is illustrated, it is contemplated that the spindle speed may be at least 2,000 RPM and may be as high as 60,000 RPM. Furthermore, instead of a $CO_2$ laser, other wavelengths of laser irradiation may be used such that their absorption coefficient within the coating layers 106 is significantly higher (by about at least an order of magnitude based on the wavelength of the laser) than that of the substrate. Use of these different lasers may produce varying degrees of BSC improvement. It is contemplated that lasers having wavelengths between about 1.2 and 15 microns may be used, preferably between about 9 and 11 microns, and most preferably about 9.3, 9.6 or 10.6 microns.

Although lasers with specific power ratings are illustrated above, it is contemplated that lower or higher powered lasers may be used as desired. For example, it is contemplated that lasers having power rating as low as 5 Watts may be used to achieve reduced BSC.

Figure 7A:
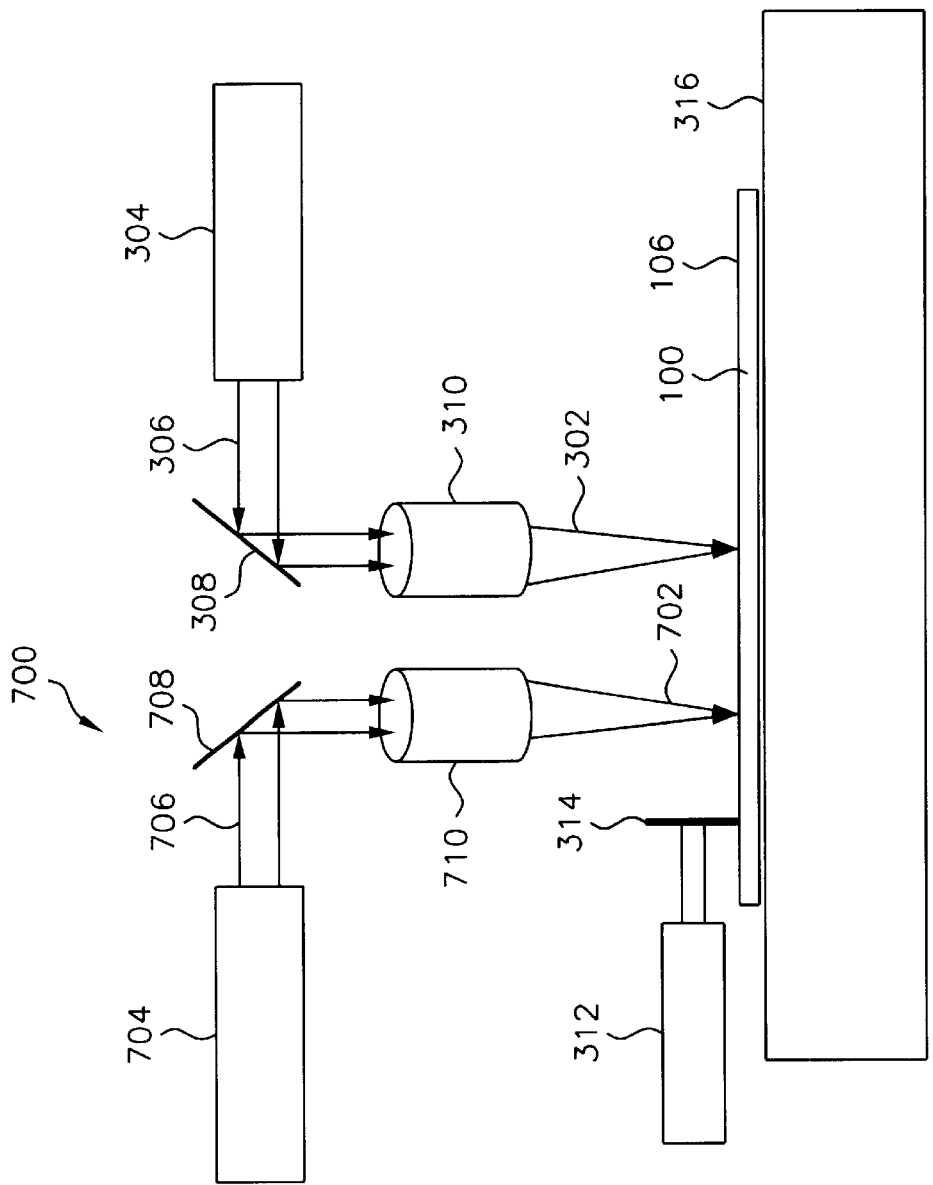
FIGS. 7A and 7B are diagrams of a second exemplary embodiment of the present invention.
Figure 10:
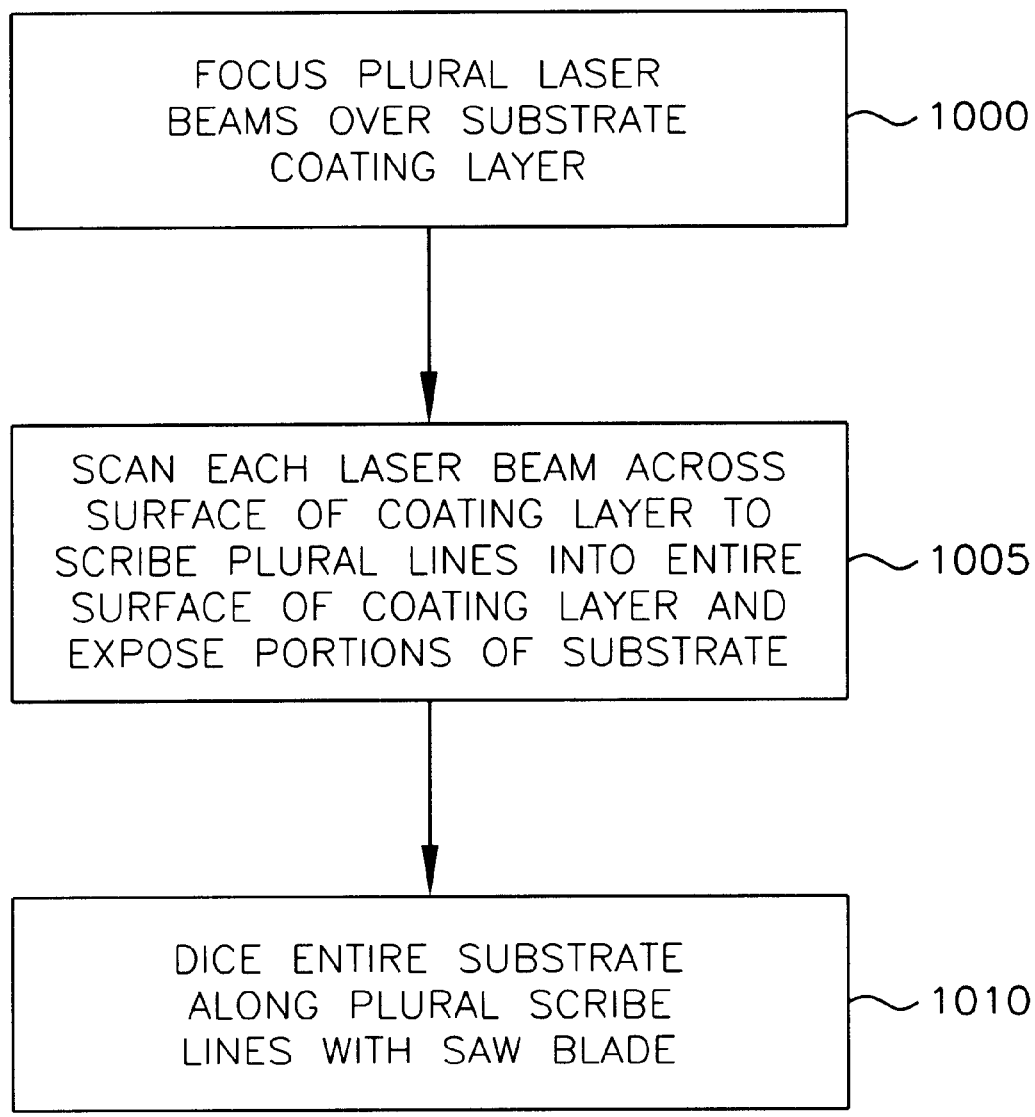
FIG. 10 is a flow chart of an exemplary method of the present invention.

Referring now to FIG. 7A, a second exemplary embodiment of the present invention is shown and described in the flow chart of FIG. 10. The second exemplary embodiment is similar to the first exemplary embodiment except for the addition of second laser assembly 700, including laser 704 (emitting laser beam 706) and mirror 708 to direct laser beam 706 onto focusing lens 710. The output of focusing lens 710 is focused beam 702 similar to focused beam 302.

The advantage of the second exemplary embodiment is that substrate 100 may be scribed about twice as fast as in the first exemplary embodiment.

Figure 7B:
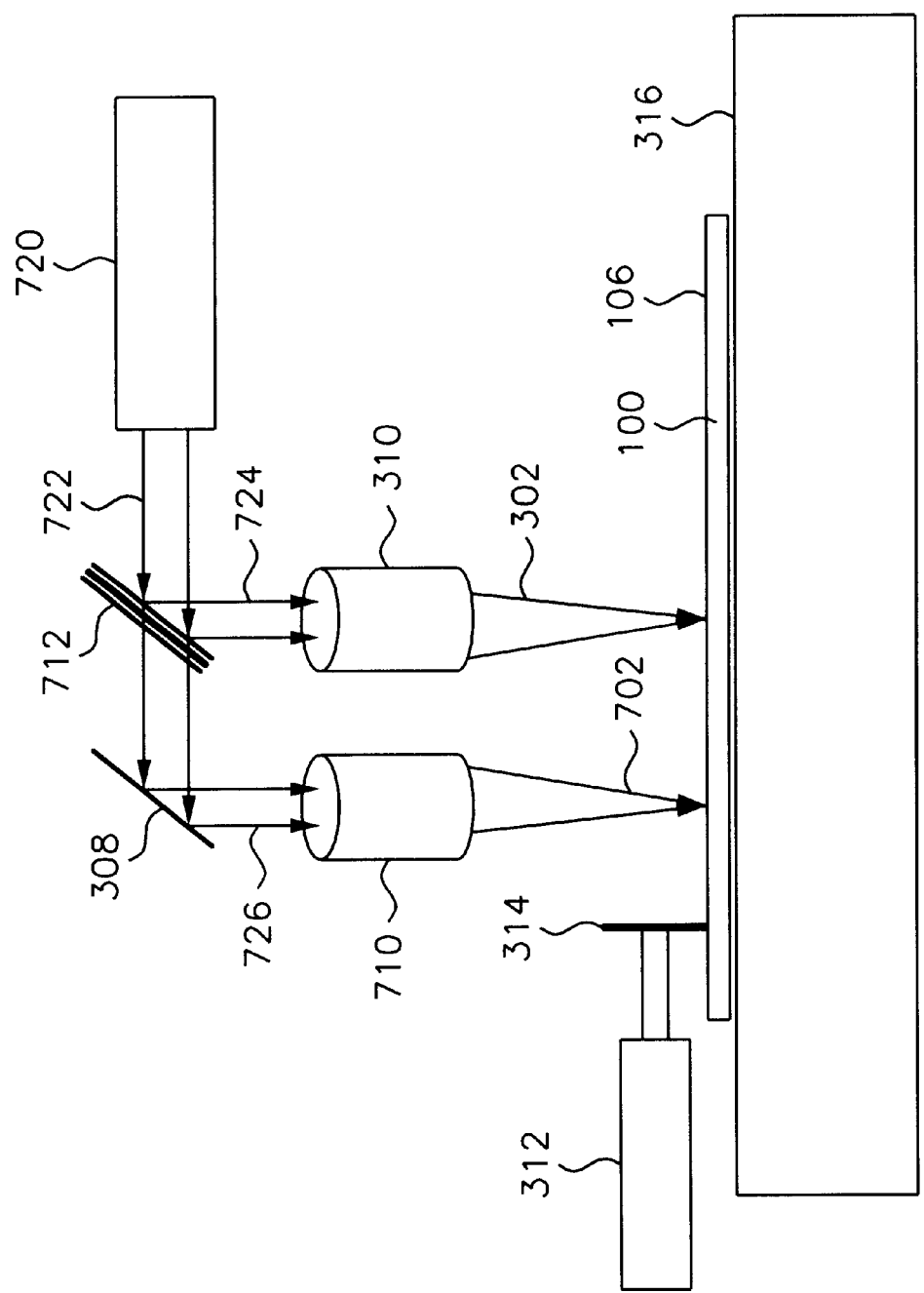

Another approach to the second exemplary embodiment is shown in FIG. 7B. As shown in FIG. 7B, a single laser source 720 having about twice the power of laser source 304 is used to generate laser beam 722, which is then split into two essentially identical laser beams 724 and 726 with beam splitter 712. The laser beams 724 and 726 are then used to generate focused laser beams 302 and 702, respectively, according to the process described above.

Referring to FIG. 10, a flow chart of the second exemplary embodiment is shown. At Step 1000, laser beams 306, 706 from laser 304, 704, respectively, are directed by mirrors 308, 708 and focused by lens 310, 710, as focused beam 302, 702, onto coating layers 106 of substrate 100. As in the first exemplary embodiment, focused laser beams 302, 702 may also be focused at a point above or below the surface of coating layers 106 or substrate 100. At Step 1005, focused laser beams 302, 702 are scanned across the surface of the substrate coating layers 106 in a linear motion to remove portions all layers 106 by evaporation and form scribe lines 102, 104. At Step 1010, substrate 100 is diced by penetrating substrate 100 along scribe lines 102, 104 with saw blade 314, under control of motor/spindle assembly 312, to form dies 100a, 100b, etc.

Figure 8A:
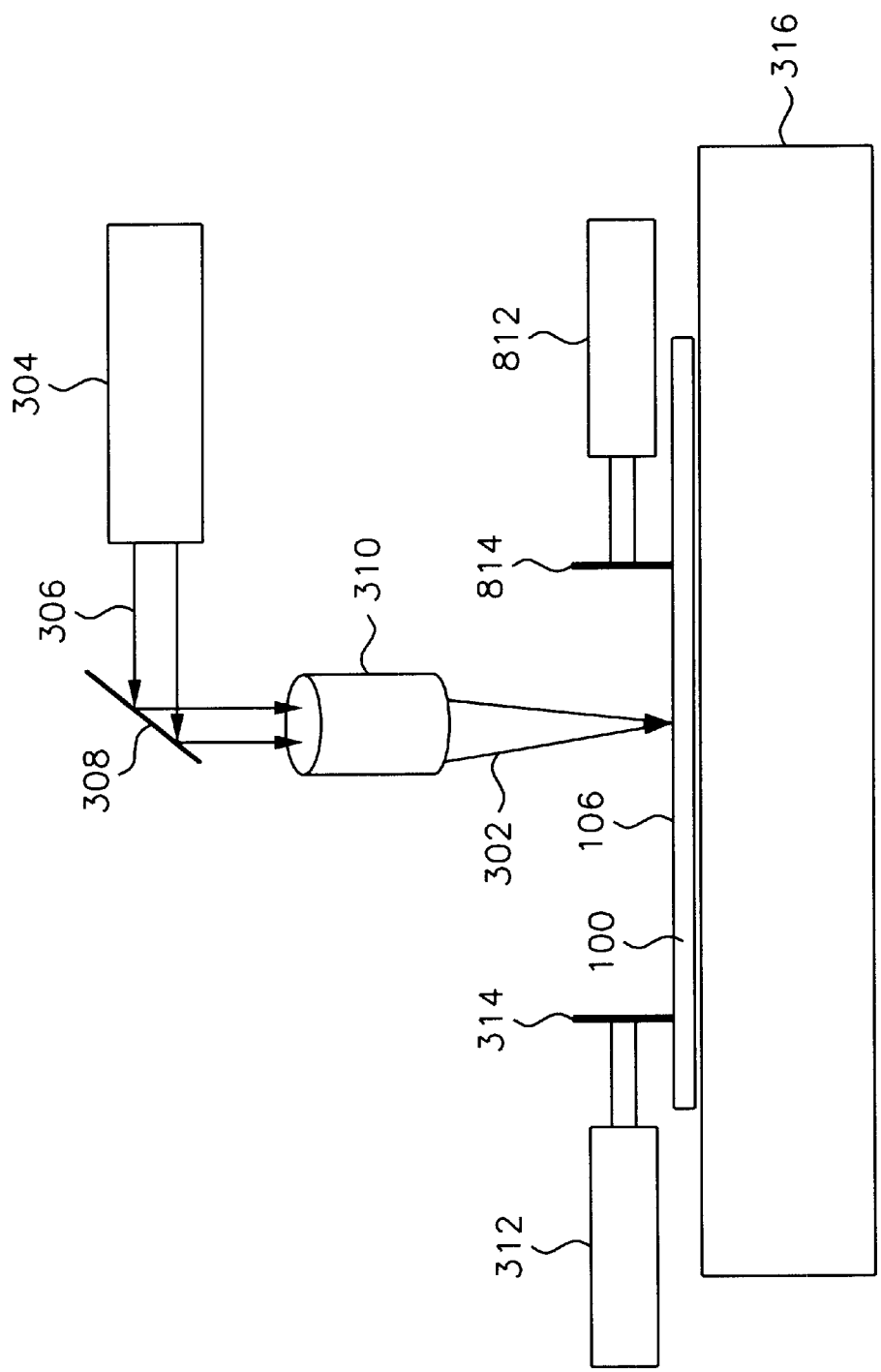
FIGS. 8A and 8B are diagrams of a third exemplary embodiment of the present invention.
Figure 8B:
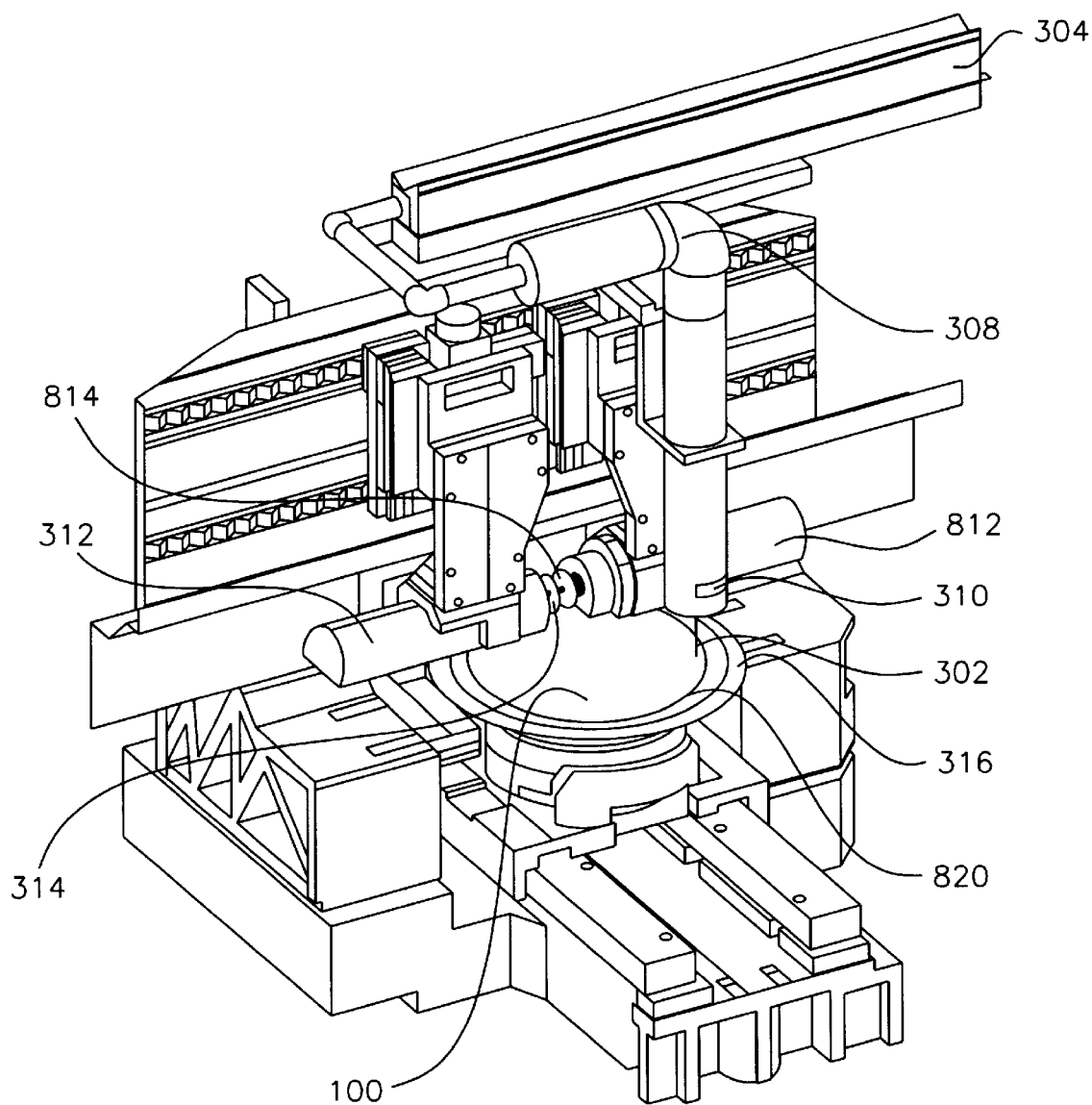
Figure 11:
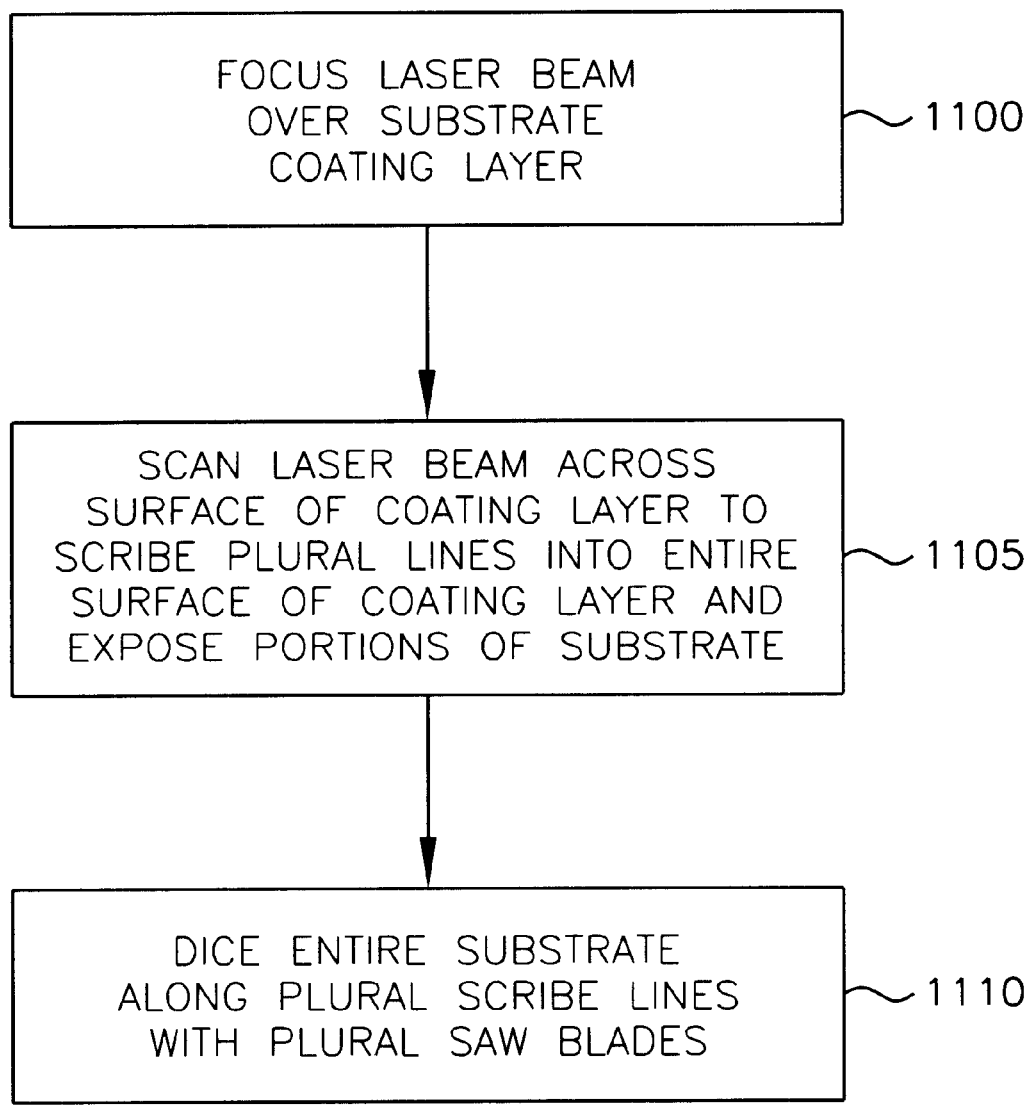
FIG. 11 is a flow chart of a second exemplary method of the present invention.

Referring now to FIGS. 8A and 8B, a third exemplary embodiment of the present invention is shown and described in the flow chart of FIG. 11. The third exemplary embodiment is similar to the first exemplary embodiment (Steps 1100 and 1105) except for the addition of a second motor/spindle assembly 812 and dicing blade 814. In this exemplary embodiment, at Step 1110, saw blades 314, 814 penetrate substrate 100 (along streets 104, 106) either i) after the entire substrate is scribed along either one or both directions or ii) while the focused laser beam 302 is scribing other portions of substrate 100. As shown in FIG. 8B, substrate 100 is attached to table 316 with detachable means, such as NITTO tape 820. As described above, substrate 100 may also be detachably mounted to table 316 using vacuum.

Figure 9A:
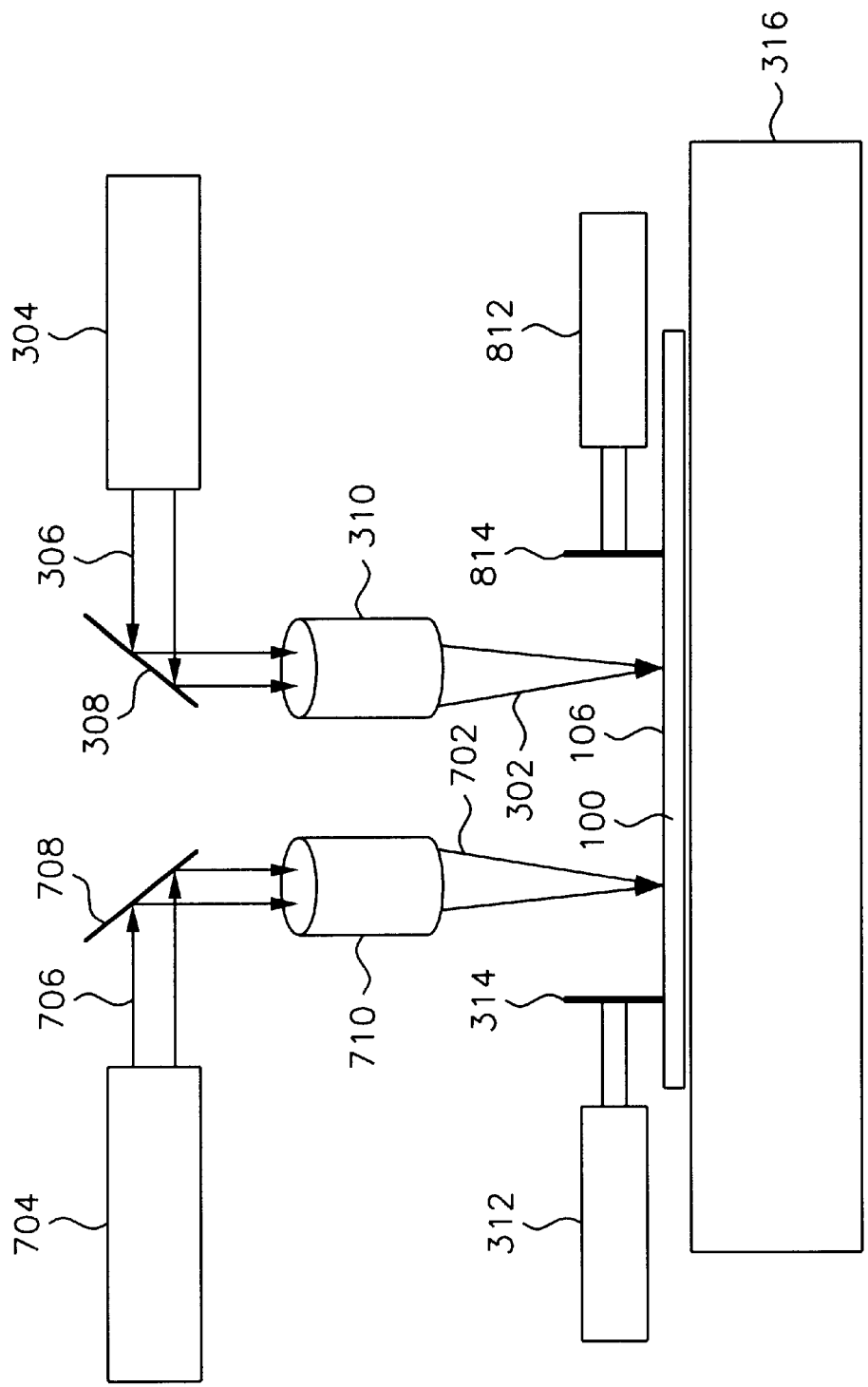
FIGS. 9A and 9B are diagrams of a fourth exemplary embodiment of the present invention.
Figure 9B:
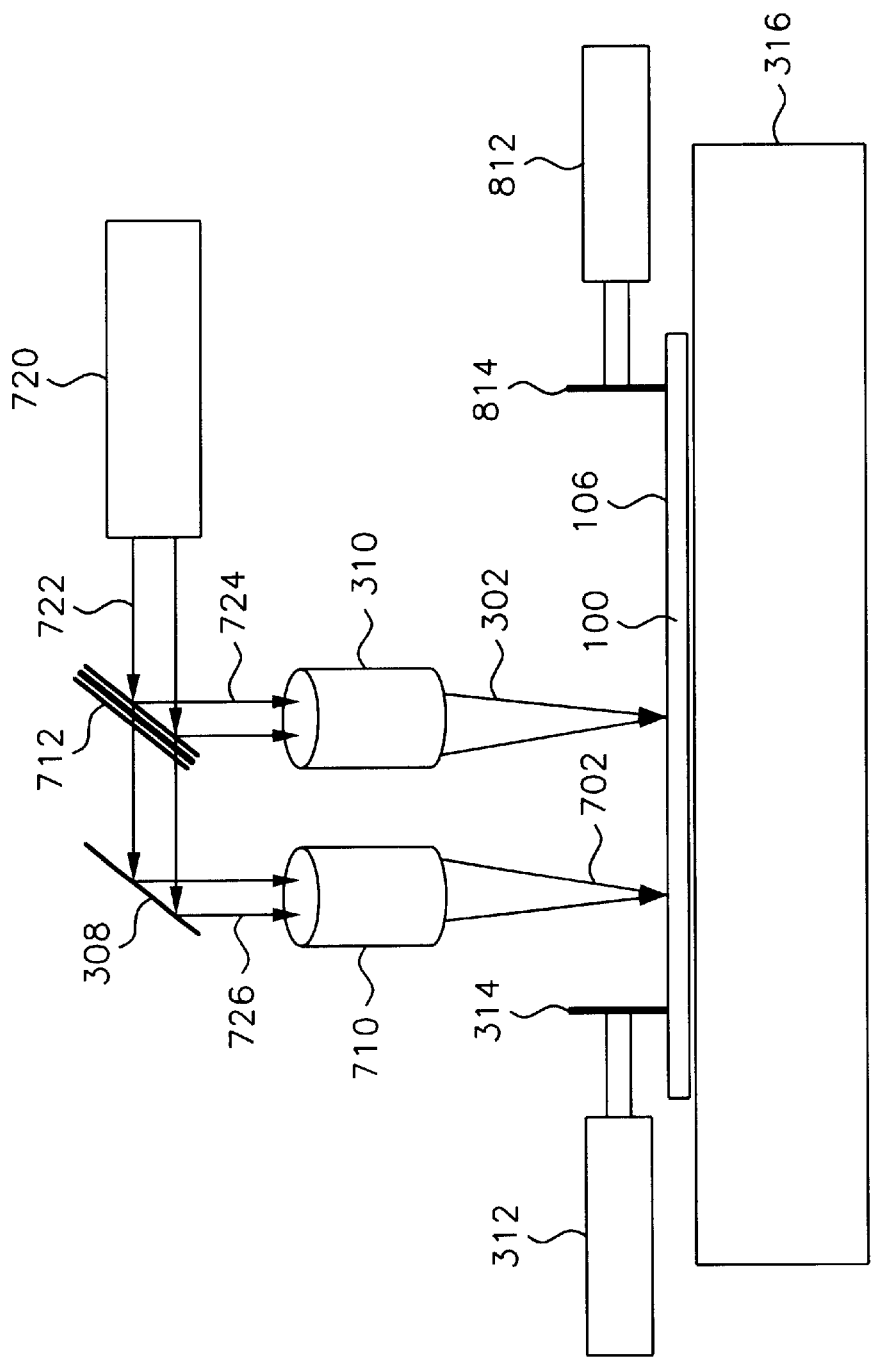

Referring now to FIGS. 9A and 9B, a fourth exemplary embodiment of the present invention is shown. The fourth exemplary embodiment is essentially a combination of the second and third exemplary embodiments. As such, a description of the constituent parts and their respective function(s) is not repeated. The fourth exemplary embodiment has the added advantage of not only increased throughput with respect to scribing the coating layers, but also increased throughput with respect to penetrating the substrate with the saw blade to form the various dies.

Furthermore, rather that scribing the entire surface of the substrate before sawing, it is contemplated that, as each scribe line is formed, saw blade(s) 314 and/or 814 (depending on the layout of the apparatus) may be used to saw along that scribe line(s). Subsequent scribe lines may then be formed and sawed in sequence in the first direction across the surface of the substrate followed by a similar procedure along the second direction of the substrate to form the dice.

Figure 12:
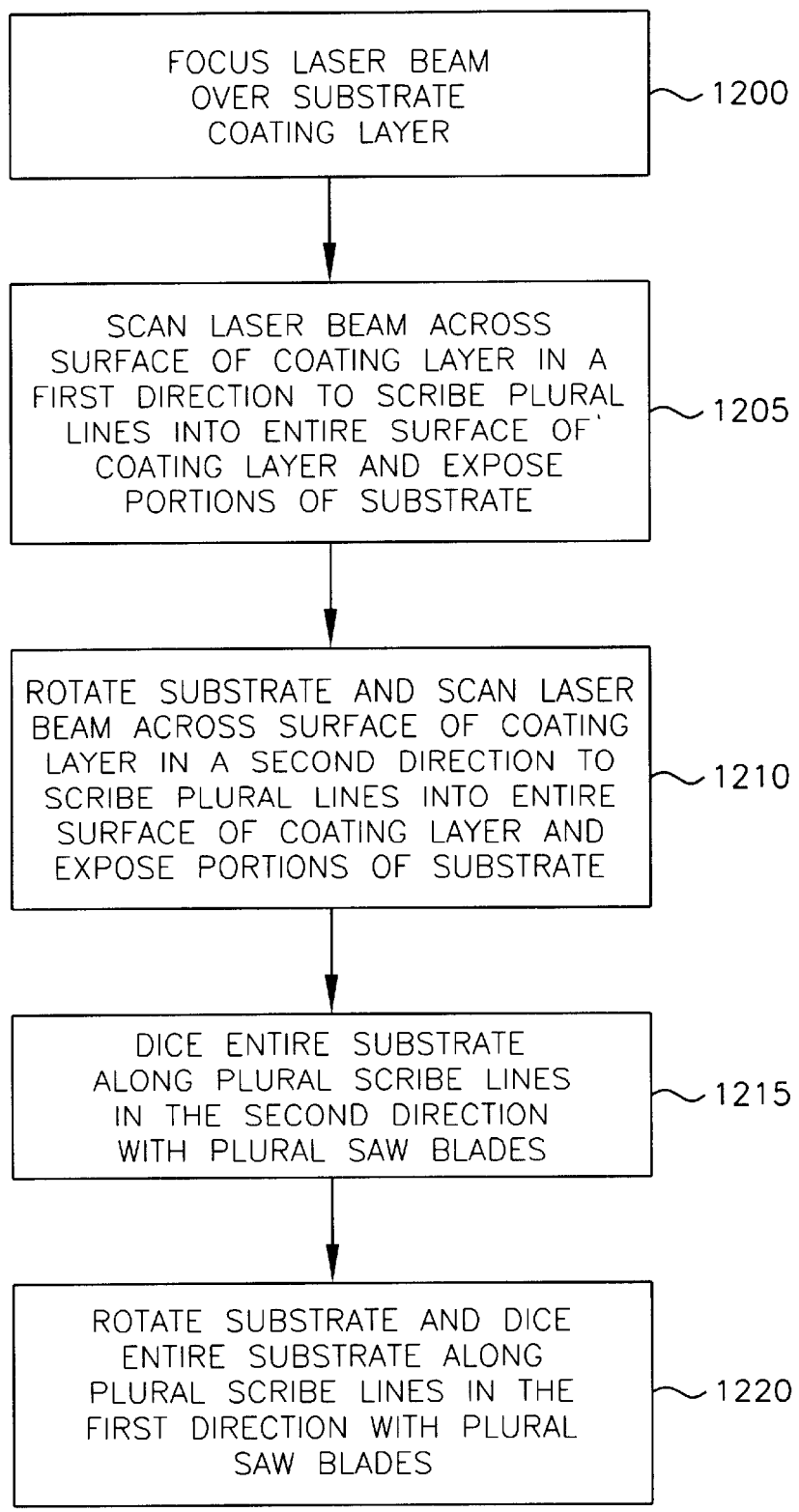
FIG. 12 is a flow chart of a third exemplary method of the present invention.
Figure 13:
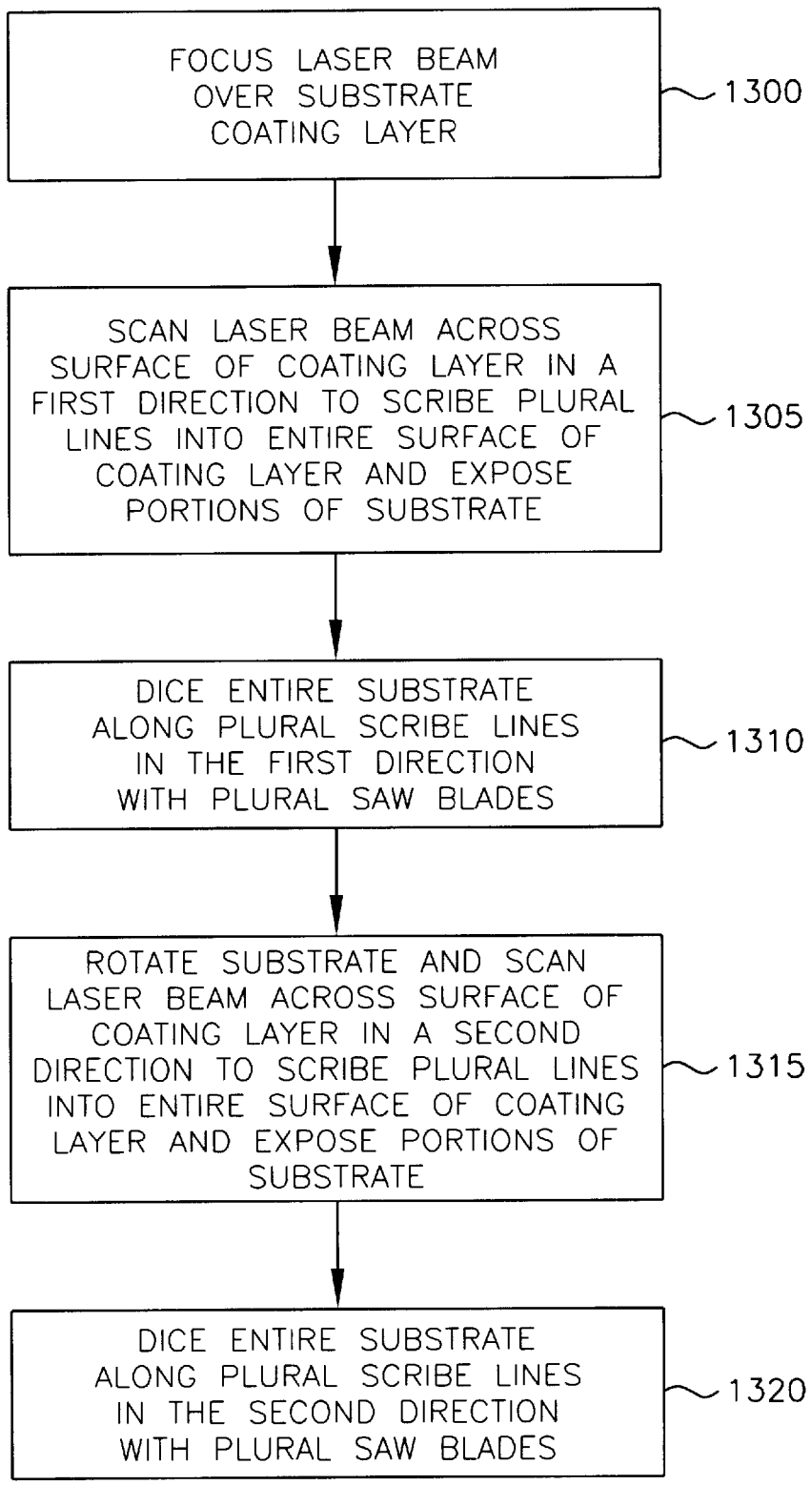
FIG. 13 is a flow chart of a fourth exemplary method of the present invention.

It is also contemplated that the laser scribing and dicing may be performed in alternate ways. Flowcharts of these alternatives are illustrated in FIGS. 12 and 13. In FIG. 12, at Step 1200, focused beam 302, is directed onto coating layers 106 of substrate 100. At Step 1205, focused laser beam 302 is scanned across the surface of the substrate coating layers 106 in a linear motion (and in a first direction) to remove portions all layers 106 by evaporation and form scribe lines 102. At Step 1210, substrate 100 is rotated (preferably at an angle of about 90°) and focused laser beam 302 is scanned across the surface of the substrate coating layers 106 in a second direction to remove portions all layers 106 by evaporation and form scribe lines 104. At Step 1215, substrate 100 is diced by penetrating substrate 100 along scribe lines 104 with saw blade 314, under control of motor/spindle assembly 312. At Step 1220, substrate 100 is rotated to its original position and diced by penetrating substrate 100 along scribe lines 102 with saw blade 314, under control of motor/spindle assembly 312, to form dies 100a, 100b, etc. This exemplary method may be performed on either a single machine incorporating both the laser scribing apparatus and the dicing apparatus, or with two machines, a first machine incorporating the laser scriber and the second machine incorporating the dicing mechanism. In the latter, the scribed wafer may be automatically transported between the laser scriber and the dicer by means of a conveyer system, or other suitable means.

Referring now to FIG. 13, a fourth exemplary method is illustrated. At Step 1300, focused beam 302, is directed onto coating layers 106 of substrate 100. At Step 1305, focused laser beam 302 is scanned across the surface of the substrate coating layers 106 in a linear motion (and in a first direction) to remove portions all layers 106 by evaporation and form scribe lines 102. At Step 1310, substrate 100 is diced by penetrating substrate 100 along scribe lines 102 with saw blade 314, under control of motor/spindle assembly 312. At Step 1315, substrate 100 is rotated (preferably at an angle of about 90°) and focused laser beam 302 is scanned across the surface of the substrate coating layers 106 in a second direction to remove portions all layers 106 by evaporation and form scribe lines 104. At Step 1320, substrate 100 is diced by penetrating substrate 100 along scribe lines 104 with saw blade 314, under control of motor/spindle assembly 312, to form dies 100a, 100b, etc.

Although the above two examples discuss scribing with a single laser beam, it is contemplated that these methods may also be performed using the dual beams described above.

Although the invention has been described with reference to exemplary embodiments, it is not limited thereto. Rather, the appended claims should be construed to include other variants and embodiments of the invention, which may be made by those skilled in the art without departing from the true spirit and scope of the present invention.

What is claimed:

1. A method for dicing a semiconductor substrate comprising the steps of:
    (a) aiming a laser beam at a layer placed over a top surface of the substrate, the layer having a first absorption coefficient relative to a wavelength of the laser beam;
    (b) absorbing energy from the laser beam into the layer based on the first absorption coefficient;
    (c) forming a first set of scribe lines in a first direction in the layer by scanning the laser beam across the layer, the laser beam removing at least a portion of the layer;
    (d) forming a second set of scribe lines in a second direction in the layer by scanning the laser beam across the layer and removing at least a portion of the layer with the laser beam, the second direction substantially orthogonal to the first direction;
    (e) cutting through the substrate along the second set of scribe lines with a saw blade to form a respective first set of kerfs; and
    (f) cutting through the substrate along the first set of scribe lines with the saw blade to form a respective second set of kerfs, wherein the substrate has a second absorption coefficient relative to the wavelength of the laser beam, the second absorption coefficient less than the first absorption coefficient by about an order of an order of magnitude.

2. The method according to claim 1, wherein the laser emits infrared radiation.

3. The method according to claim 2, wherein the wavelength of the laser is between about 1.2 and 15 microns.

4. The method according to claim 2, wherein the wavelength of the laser is between about 9 and 11 microns.

5. The method according to claim 2, wherein the wavelength of the laser is one of i) 9.3, ii) 9.6 and iii) 10.6 microns.

6. The method according to claim 1, wherein the layer is a plurality of layers and the second absorption coefficient of the substrate is less than each respective absorption coefficient of the plurality of layers.

7. The method according to claim 1, wherein a width of the laser scribe lines is greater than that of the saw blade kerfs.

8. The method according to claim 1, wherein each one of i) the first set of scribe lines and the first set of kerfs are substantially parallel to one another, and ii) each one of the second set of scribe lines and second set of kerfs are substantially parallel to one another.

9. The method according to claim 1, wherein the laser beam is formed by a CO2 laser.

10. The method according to claim 1, wherein the scribe lines have a depth equal to a depth of the layer.

11. The method according to claim 1, wherein the scribe lines have a depth no greater than a depth of the layer.

12. The method according to claim 1, wherein the substrate is silicon based and the layer over the substrate is other than silicon based.

13. The method according to claim 1, wherein the second absorption coefficient is less than the first absorption coefficient by at least an order of magnitude.

14. A method for dicing a semiconductor substrate comprising the steps of:
  (a) aiming a laser beam at a layer placed over a top surface of the substrate, the layer having a first absorption coefficient relative to a wavelength of the laser beam;
  (b) absorbing energy from the laser beam into the layer based on the first absorption coefficient;
  (c) forming a first set of scribe lines in a first direction in the layer by scanning the laser beam across the layer, the laser beam removing at least a portion of the layer;
  (d) forming a second set of scribe lines in a second direction in the layer by scanning the laser beam across the layer and removing at least a portion of the layer with the laser beam, the second direction substantially orthogonal to the first direction;
  (e) cutting through the substrate along the second set of scribe lines with a saw blade to form a respective first set of kerfs; and
  (f) cutting through the substrate along the first set of scribe lines with the saw blade to form a respective second set of kerfs,
  wherein the substrate has a second absorption coefficient relative to the wavelength of the laser beam, the second absorption coefficient less than the first absorption coefficient by about an order of an order of magnitude.

15. A method for dicing a semiconductor substrate comprising the steps of:
  (a) aiming a laser beam at a layer placed over a top surface of the substrate;
  (b) absorbing energy from the laser beam into only the layer;
  (c) forming a first set of scribe lines in a first direction in the layer by scanning the laser beam across the layer, the laser beam removing at least a portion of the layer;
  (d) forming a second set of scribe lines in a second direction in the layer by scanning the laser beam across the layer and removing at least a portion of the layer with the laser, the second direction substantially orthogonal to the first direction;
  (e) cutting through the substrate along the second set of scribe lines with a saw blade to form a respective first set of kerfs, and
  (f) cutting through the substrate along the first set of scribe lines with the saw blade to form a respective second set of kerfs,
  wherein the layer has a first absorption coefficient and the substrate has a second absorption coefficient relative to a wavelength from the laser beam, the first absorption coefficient greater than the second absorption coefficient.

16. The method according to claim 15, wherein the first absorption coefficient is greater than the second absorption coefficient by at least an order of magnitude.

17. A method for dicing a semiconductor substrate using a laser and a saw blade, the method comprising the steps of:
  (a) aiming the laser at a layer placed over a top surface of the substrate;
  (b) absorbing energy from the laser into the layer;
  (c) forming a first set of scribe lines in a first direction in the layer by scanning the laser across the layer, the laser removing at least a portion of the layer;
  (d) forming a second set of scribe lines in a second direction in the layer by scanning the laser across the layer and removing at least a portion of the layer with the laser, the second direction substantially orthogonal to the first direction;
  (e) cutting a first set of kerfs in the substrate with the saw blade along the second set of scribe lines; and
  (f) cutting a second set of kerfs in the substrate with the saw blade along the first set of scribe lines,
  wherein the layer has a first absorption coefficient and the substrate has a second absorption coefficient relative to a wavelength of the laser beam, the first absorption coefficient greater than the second absorption coefficient by about an order of an order of magnitude, and the first set of kerfs and the second set of kerfs form a plurality of dice from the substrate.

18. The method according to claim 17, wherein the first absorption coefficient is greater than the second absorption coefficient by at least an order of magnitude.

19. A method for dicing a semiconductor substrate using a laser and a saw blade, the method comprising the steps of:
  (a) aiming the laser at a layer placed over a top surface of the substrate;
  (b) absorbing energy from the laser into the layer;
  (c) forming a first scribe line in a first direction in the layer by scanning the laser across the layer, the laser removing at least a portion of the layer;
  (d) cutting a first kerf in the substrate with the saw blade along the first scribe line;
  (e) forming a further first scribe line in the first direction over the substrate, the further scribe line substantially parallel to the first scribe line;

(f) cutting a further first kerf in the substrate with the saw blade along the further first scribe line;

(g) repeating steps (e) and (f) in the first direction until the entire substrate is scribed and cut;

(h) forming a second scribe line in a second direction in the layer by scanning the laser across the layer and removing at least a portion of the layer, the second direction substantially orthogonal to the first direction;

(i) cutting a second kerf in the substrate with the saw blade along the second scribe line;

(j) forming a further second scribe line in the second direction on the substrate, the further second scribe line substantially parallel to the second scribe line;

(k) cutting a further second kerf in the substrate with the saw blade along the further second scribe line; and (l) repeating steps (j) and (k) in the second direction until the entire substrate is scribed and cut, wherein the layer has a first absorption coefficient and the substrate has a second absorption coefficient relative to a wavelength of the laser beam, the first absorption coefficient greater than the second absorption coefficient by about an order of magnitude, and the first kerf, the further first kerfs, the second kerf and the further second kerfs form a plurality of dice from the substrate.

20. The method according to claim 19, wherein the first absorption coefficient is greater than the second absorption coefficient by at least an order of magnitude.

21. A method for dicing a semiconductor substrate comprising the steps of:

(a) aiming a plurality of individual laser beams at a layer placed over a top surface of the substrate, the layer having a first absorption coefficient relative to a respective wavelength of the each of the plurality of laser beams;

(b) absorbing energy from the plurality of laser beams into the layer based on the first absorption coefficient;

(c) forming a respective first set of scribe lines for each of the plurality of lasers beams in a first direction in the layer by scanning the plurality of laser beams across the layer, the plurality of laser beams removing at least a portion of the layer;

(d) forming a respective second set of scribe lines in a second direction in the layer by scanning the plurality of laser beams across the layer and removing at least a portion of the layer;

(e) cutting through the substrate along the second set of scribe lines with a saw blade to form a respective first set of kerfs; and (f) cutting through the substrate along the first set of scribe lines with the saw blade to form a respective second set of kerfs, wherein the substrate has a second absorption coefficient relative to the wavelength of the laser beam, the second absorption coefficient less than the first absorption coefficient.

22. The method according to claim 21, wherein the second direction substantially orthogonal to the first direction.

23. The method according to claim 21, wherein the plurality of laser beams are generated by respective laser sources.

24. The method according to claim 21, wherein the plurality of laser beams are two laser beams.

25. The method according to claim 24, wherein the two laser beams are generated by splitting a single laser beam emitted from a single laser source.

26. A method for dicing a semiconductor substrate comprising the steps of:

(a) aiming a laser beam at a layer placed over a top surface of the substrate, the layer having a first absorption coefficient relative to a wavelength of the laser beam;

(b) absorbing energy from the laser beam into the layer based on the first absorption coefficient;

(c) forming a first set of scribe lines in a first direction in the layer by scanning the laser beam across the layer, the laser beam removing at least a portion of the layer;

(d) forming a second set of scribe lines in a second direction in the layer by scanning the laser beam across the layer and removing at least a portion of the layer with the laser beam, the second direction substantially orthogonal to the first direction, (e) cutting through the substrate along the second set of scribe lines with to form a respective first set of kerfs, each spindle holding and rotating a respective saw blade, and (f) cutting through the substrate along the first set of scribe lines with the two spindles to form a respective second set of kerfs, wherein the substrate has a second absorption coefficient relative to the wavelength of the laser beam, the second absorption coefficient less than the first absorption coefficient.

27. A method for dicing a semiconductor substrate comprising the steps of:

(a) aiming a plurality of individual laser beams at a layer placed over a top surface of the substrate, the layer having a first absorption coefficient relative to a respective wavelength of each of the plurality of laser beams;

(b) absorbing energy from the plurality of laser beams into the layer based on the first absorption coefficient;

(c) forming a respective first set of scribe lines for each of the plurality of lasers beams in a first direction in the layer by scanning the plurality of laser beams across the layer, the plurality of laser beams removing at least a portion of the layer;

(d) forming a respective second set of scribe lines in a second direction in the layer by scanning the plurality of laser beams across the layer and removing at least a portion of the layer with the plurality of laser beams;

(e) forming a respective first set of kerfs by cutting through the substrate along the second set of scribe lines with two spindles, each spindle holding and rotating a respective saw blade; and (f) forming a respective second set of kerfs by cutting through the substrate along the first set of scribe lines with the two spindles each one holding and rotating a saw blade.

28. The method according to claim 27, wherein the substrate has a second absorption coefficient relative to the respective wavelength of each of the plurality of laser beams, the second absorption coefficient less than the first absorption coefficient.

29. An apparatus for dicing a semiconductor substrate having a coating layer, the apparatus comprising:

means for forming at first set of scribe lines in a first direction in the layer and removing at least a portion of the layer;

means for forming a second set of scribe lines in a second direction in the layer and removing at least a portion of the layer in a substantially orthogonal direction to the first set of scribe lines, means for cutting through the substrate along the second set of scribe lines to form a respective first set of kerfs, and means for cutting through the substrate along the first set of scribe lines to form a respective second set of kerfs, wherein the substrate has a second absorption coefficient relative to a wavelength of the forming means, the second absorption coefficient less than the first absorption coefficient by about an order of an order of magnitude.

30. An apparatus for dicing a semiconductor substrate having a coating layer, the apparatus comprising:

means for forming a first scribe line in a first direction in only the coating layer;

means for cutting a first kerf in the substrate along the first scribe line;

means for forming a further first scribe line in the first direction in only the coating layer, the further scribe line substantially parallel to the first scribe line;

means for cutting a further first kerf in the substrate along the further first scribe line;

means for forming a second scribe line in a second direction in only the coating layer, the second direction substantially orthogonal to the first direction;

means for cutting a second kerf in the substrate along the second scribe line;

means for forming a further second scribe line in only the coating layer in the second direction on the substrate, the further second scribe line substantially parallel to the second scribe line; and means for cutting a further second kerf in the substrate along the further second scribe line;

wherein the coating layer has a first absorption coefficient and the substrate has a second absorption coefficient relative to a wavelength of the forming means, the first absorption coefficient greater than the second absorption coefficient by about an order of magnitude, and the first kerf, the further first kerfs, the second kerf and the further second kerfs form a plurality of dice from the substrate.

31. An system for dicing a semiconductor substrate having a coating layer, the system comprising:

a scribing apparatus including:
  i) means for forming at first set of scribe lines in a first direction in the layer and removing at least a portion of the layer; and
  ii) means for forming a second set of scribe lines in a second direction in the layer and removing at least a portion of the layer in a substantially orthogonal direction to the first set of scribe lines, and a dicing apparatus including:
  i) means for cutting through the substrate along the second set of scribe lines to form a respective first set of kerfs, and
  ii) means for cutting through the substrate along the first set of scribe lines to form a respective second set of kerfs, wherein the substrate has a second absorption coefficient relative to a wavelength of the forming means, the second absorption coefficient less than the first absorption coefficient by about an order of an order of magnitude.

* * * * *